United States Patent
Nuessle

(10) Patent No.: US 10,794,949 B2
(45) Date of Patent: Oct. 6, 2020

(54) POWER SUPPLY DEVICE, A TEST EQUIPMENT COMPRISING A POWER SUPPLY DEVICE AND A METHOD FOR OPERATING A POWER SUPPLY DEVICE

(71) Applicant: Advantest Corporation, Tokyo (JP)

(72) Inventor: Heinz Nuessle, Rottenburg am Neckar (DE)

(73) Assignee: ADVANTEST CORPORATION, Tokyo (JP)

(*) Notice: Subject to any disclaimer, the term of this patent is extended or adjusted under 35 U.S.C. 154(b) by 376 days.

(21) Appl. No.: 15/182,912

(22) Filed: Jun. 15, 2016

(65) Prior Publication Data
US 2016/0291081 A1    Oct. 6, 2016

Related U.S. Application Data

(63) Continuation of application No. PCT/EP2013/077514, filed on Dec. 19, 2013.

(51) Int. Cl.
G01R 31/27    (2006.01)
G01R 31/28    (2006.01)
(Continued)

(52) U.S. Cl.
CPC ... *G01R 31/2834* (2013.01); *G01R 31/31721* (2013.01); *G06F 11/2733* (2013.01); *G01R 31/31903* (2013.01)

(58) Field of Classification Search
CPC ........ G01R 31/27; G01R 31/28; G01R 31/31; H02H 7/125; H02H 9/02; H02H 3/08
See application file for complete search history.

(56) References Cited

U.S. PATENT DOCUMENTS 5,034,871  A    7/1991    Okamoto et al.
6,327,545  B1    12/2001    Browen et al.
(Continued)

FOREIGN PATENT DOCUMENTS

EP    0626588    11/1994
EP    0984291    3/2000
(Continued)

OTHER PUBLICATIONS

Nieuwoudt, I et al., "Algorithms for a Shared Resource Scheduling Problem in Which Some Level of Conflict is Tolerable," Journal of Scheduling, Kluwer Academic Publishers, vol. 15, No. 6, Sep. 29, 2012, pp. 681-702.
(Continued)

*Primary Examiner* — Neel D Shah

(57) ABSTRACT

A power supply device for a test equipment, test equipment having a power supply device and a method for operating a power supply device are described. The power supply device is configured for an at least partly capacitive load and has an output voltage provider configured to generate a target voltage, which is energized by an input supply voltage provided at an input of the power supply, wherein the target voltage generates an output supply voltage at the capacitive load, when the capacitive load is connected to an output of the power supply and a supply current monitor configured to monitor supply current flowing into the input of the power supply and to temporarily reduce the target voltage generating the output supply voltage, if a current value of the supply current exceeds a first predetermined threshold.

14 Claims, 5 Drawing Sheets

(51) Int. Cl.
*H02H 7/12* (2006.01)
*H02H 9/02* (2006.01)
*H02H 3/08* (2006.01)
*G01R 31/317* (2006.01)
*G06F 11/273* (2006.01)
*G01R 31/319* (2006.01)

(56) References Cited

U.S. PATENT DOCUMENTS

| | | | |
|---|---|---|---|
| 6,397,160 | B1 | 5/2002 | Craig et al. |
| 6,795,496 | B1 | 9/2004 | Soma et al. |
| 7,038,436 | B2 | 5/2006 | Goto et al. |
| 7,256,585 | B1 | 8/2007 | Shoulders |
| 2004/0004466 | A1* | 1/2004 | Miyanaga ............... G05F 1/573 323/277 |
| 2005/0050546 | A1 | 3/2005 | Remany et al. |
| 2005/0068068 | A1 | 3/2005 | Hall |
| 2005/0162216 | A1 | 7/2005 | Ueda |
| 2005/0234662 | A1 | 10/2005 | Niedzwiecki et al. |
| 2007/0002592 | A1 | 1/2007 | Muramatsu |
| 2009/0092177 | A1 | 4/2009 | Dvorak et al. |
| 2009/0129129 | A1 | 5/2009 | Udagawa |
| 2009/0272634 | A1 | 11/2009 | Ehlers et al. |
| 2010/0225301 | A1 | 9/2010 | Nakayama et al. |
| 2010/0228515 | A1 | 9/2010 | Srinivasan et al. |
| 2010/0309952 | A1 | 12/2010 | Asami |
| 2010/0312506 | A1 | 12/2010 | Taylor |
| 2011/0227767 | A1 | 9/2011 | O'Brien |
| 2012/0049655 | A1 | 3/2012 | Leyendecker et al. |
| 2012/0221279 | A1 | 8/2012 | Zhang |
| 2012/0268063 | A1* | 10/2012 | Qiu ............... H02J 7/022 320/107 |
| 2012/0277942 | A1* | 11/2012 | Vilar ............... B60L 50/13 701/22 |
| 2013/0006567 | A1 | 1/2013 | Horn |
| 2013/0229068 | A1 | 9/2013 | Sanders, III et al. |
| 2013/0234723 | A1 | 9/2013 | Behrens et al. |
| 2014/0028268 | A1* | 1/2014 | Bourgeois ............... H02J 7/00 320/156 |

FOREIGN PATENT DOCUMENTS

| | | |
|---|---|---|
| EP | 1298778 | 4/2003 |
| JP | H11038087 | 2/1999 |
| JP | 2000009792 | 1/2000 |
| WO | 99/21025 | 4/1999 |
| WO | 2012/084028 | 6/2012 |
| WO | 2014/135194 | 9/2014 |

OTHER PUBLICATIONS

Liu, Lei, "Finite Automata for Evaluating Testbed Resource Contention," IEEE, Wireless Telecommunications Symposium WTS 2007, Piscataway, NJ, Apr. 26, 2007, pp. 1-6.

Quintanel, S., et al., "On-Wafer Multi-Port Circuits Characterization Technique with a Two-Port VNA," IEEE 81st ARFTG Microwave Measurement Conference, Seattle, WA, Jun. 7, 2013, pp. 1-4.

Lenk, F., et al., "A New Multiport Measurement-Method Using a Two-Port Network Analyzer," IEEE MH-S International Microwave Symposium, Jun. 12-17, 2005, pp. 1663-1666.

Kam, D.G., et al., "Multiport Measurement Method Using a Two-Port Network Analyzer With Remaining Ports Unterminated," IEEE Microwave and Wireless Components Letters, vol. 17, No. 9, Sep. 2007, pp. 694-696.

Chen, C.-J., et al., "An Error Analysis of the Scattering Matrix Renormalization Transform," IEEE Transactions on Microwave Theory and Techniques, vol. 57, No. 4, Apr. 2009, pp. 863-868.

Rolfes, I., et al., "Multiport Method for the Measurement of the Scattering Parameters of N-Ports," IEEE Transactions on Microwave Theory and Techniques, vol. 53, No. 6, Jun. 2005, pp. 1990-1996.

Sismanoglou, P., et al, "Input Test Data Compression Based on the Reuse of Parts of Dictionary Entries: Static and Dynamic Approaches," IEEE Transactions on Computer-Aided Design of Integrated Circuits and Systems, vol. 32, No. 11, Nov. 2013, pp. 1762-1775.

White, H.E., "Printed English Compression by Dictionary Encoding," Proceedings of the IEEE, vol. 55, No. 3, Mar. 1967, pp. 390-396.

Ting, Shang-Kee et al., "An Algorithm to Compensate the Effects of Spurious PLL Tones in Spectrum Sensing Architectures", IEEE Transactions on Circuits and Systems, I: Regular Papers, vol. 59, No. 5, May 1, 2012, pp. 1093-1106.

Jamal, Shafiq M. et al., "Calibration of Sample-Time Error in a Two-Channel Time-Interleaved Analog-to-Digital Converter," IEEE Transactions on Circuits and Systems, I: Regular Papers, vol. 51, No. 1, Jan. 1, 2004, pp. 130-139.

Marple, S. Lawrence Jr., "Computing the Discrete-Time 'Analytic' Signal via FFT," IEEE Transactions on Signal Processing, vol. 47, No. 9, Sep. 1, 1999, pp. 2600-2603.

\* cited by examiner

POWER SUPPLY DEVICE, A TEST EQUIPMENT COMPRISING A POWER SUPPLY DEVICE AND A METHOD FOR OPERATING A POWER SUPPLY DEVICE

CROSS-REFERENCE TO RELATED APPLICATION

This application is a continuation of copending International Application No. PCT/EP2013/077514, filed Dec. 19, 2013, which is incorporated herein by reference in its entirety.

BACKGROUND OF THE INVENTION

The embodiment of the present invention relates to the field of power supplies and especially to the field of power supplies for automated test equipments.

Processors used in modern computers or other equipment are very power hungry. Furthermore, their technology is CMOS (Complementary Metal Oxide Semiconductor). This means, their standby currents are low, but they need full current in nano-seconds when operating. For these reasons they need high speed and high power supplies which are able to deliver these huge currents fast enough. Testing such devices impose a great challenge and significant effort for an ATE (Automated Test Equipment) manufacturer since it has to provide appropriate high power supplies within the infrastructure of the ATE.

This is further aggravated by the fact that a processor is normally not operated in a normal mission during test but its circuitry is reconfigured in a way to achieve the highest possible fault coverage in the shortest possible amount of time. Therefore, testing such a processor or a respective processor array on ATE even necessitates a multiple of the regular operating power. Very often an ATE needs to supply currents in the 50 A to 100 A range for a single processor device under test (processor DUT), and arrays of processors need hundreds or thousands of amperes. However, this issue is not limited to processor devices only.

In the following short summary of the challenges for an automated test equipment test of extremely high power consuming devices under tests shall be given.
1) Power is needed in nano-seconds, but even very fast supplies have a reaction time (response time) only in the 1 ... 5 µs range. For the very first micro-seconds blocking capacitors have to be used.
2) Because of continuously shrinking geometries inside the processor-chip, the nominal supply voltages are decreasing. A typical allowed voltage tolerance is 5% or 10%. This relative tolerance stays stable, but the absolute value is decreasing. To stabilize now the ever shrinking voltages even more blocking capacitors are necessitated.
3) For some tests it is necessitated to jump between different supply voltages. In this case, the blocking capacitors have to be charged and dis-charged. This generates high current peaks, much higher than the nominal current of the power supply device. Finally the power for the processor has to be delivered by a so called 'raw'-supply which is the source for the power supply device we talk about. In case of very high output peak currents, this raw-supply might be overloaded, causing a crash of the whole test system. The very high peak currents are also a source of stress for the test setup, because the blocking capacitors might be over loaded due to high ripple currents. This affects the reliability of the test setup.
4) A similar effect occurs when having the power supply device programmed to the desired voltage but initially switched off. When closing the relay to provide the power to the test setup huge peak currents are generated which may stress and overload the system.
5) The capability of being able to deliver peak currents also depends on the output power which is needed to supply the load. If the power necessitated is low, there is enough margin for peak power, however, if it is high, there is only little head room for peak power.
6) Because of shrinking voltage tolerances and increasing currents, the user might use much more blocking capacitors than really necessitated. Also the number and size of such capacitors might change from setup to setup and is further modulated by tolerances of the capacitors themselves.
7) Simply interrupting the input raw-power of the supply in case of overload is avoided because it interrupts the output power totally, in this way causing an invalid test result or even damaging the DUT.

In conventional power supply systems, instead of increasing the output voltage by one big step, a voltage ramp is generated approximately by many small steps with the step size programmed to constantly increase the voltage. When connecting the DUT to the power supply device, peak currents are avoided by programming the power supply device to an initial voltage of zero. When connection is established, a ramp will be generated which realizes a smooth transition to the final voltage while limiting the peak currents to a tolerable value. This approach necessitates extensive a-priori knowledge of the device behavior. It is difficult to find the best ramp speed depending on amplitude of the voltage step, basic current load, and size of blocking capacitors. Therefore a lot of experiments are necessitated in advance to determine the average processor DUT behavior and to determine the headroom necessitated for the DUT variance. Skilled operators are necessitated for test program execution, who are aware of the situation. An additional software effort is necessitated to provide enough flexibility to control the power supply ramping.

An objective of the present invention is to provide an improved power supply device, an improved test equipment for testing an electronic device, an improved method for supplying electrical power to a capacitive load in a test arrangement and a computer program for performing the improved method, when running on a computer.

SUMMARY

According to an embodiment, a power supply device for a test equipment, which is configured for an at least partly capacitive load may have: an output voltage provider configured to generate a target voltage, which is energized by an input supply voltage provided at an input of the power supply device, wherein the target voltage generates an output supply voltage at the capacitive load, when the capacitive load is connected to an output of the power supply device; and a supply current monitor configured to monitor a supply current flowing into the input of the power supply device and to temporarily reduce the target voltage generating the output supply voltage, if a current value of the supply current exceeds a first predetermined threshold.

Another embodiment may have a test equipment, in particular an automated test equipment, for testing an electronic device, such as a processor, having a power supply device as mentioned above configured to provide an output supply voltage, which is used as a supply voltage for the electronic device, while the electronic device is being tested.

According to another embodiment, a method for supplying an electrical power to an at least partly capacitive load in a test equipment with a power supply device may have the steps of: generating a target voltage, which is energized by an input supply voltage provided at an input of the power supply device, wherein the target voltage generates an output supply voltage at the capacitive load, when the capacitive load is connected to an output of the power supply device; monitoring a supply current flowing into the input of the power supply device; and temporarily reducing the target voltage generating the output supply voltage, if a current value of the supply current exceeds a first predetermined threshold.

Still another embodiment may have a computer program for performing, when running on a computer, the above method for supplying an electrical power to an at least partly capacitive load.

Embodiments of the present invention relate to a power supply device for a test equipment, which is configured for an at least partly capacitive load and which comprises an output voltage provider and a supply current monitor.

The output voltage provider is configured to generate a target voltage, which is energized by an input supply voltage provided at an input of the power supply, wherein the target voltage generates an output supply voltage at the capacitive load, when the capacitive load ($C_1$ to $C_N$ and 201 in FIGS. 1B and 2A) is connected to an output 105 of the power supply.

The supply current monitor is configured to monitor a supply current flowing into the input of the power supply device. Furthermore, the supply current monitor is configured to temporarily reduce a target voltage generating the output supply voltage, if a current value of the supply current exceeds a predetermined threshold.

In a test equipment for electronic devices, such as processors, typically an electronic device to be tested, short: a device under test (DUT), and at least one blocking capacitor are connected parallel with respect to each other to the output of the power supply device, wherein the electronic device under test and the blocking capacitor are a capacitive load for the output of the power supply device.

The output supply voltage for the capacitive load is generated by a target voltage. As the target voltage is energized by an input supply voltage of the power supply device, the supply current flowing into the input of the power supply device correlates with the supply current flowing out of the output of the power supply device.

The target voltage is an impressed voltage internal of the power supply device, which may be controlled by the power supply device automatically. The target voltage may be produced by a controllable ideal voltage source, wherein the voltage of the voltage source is independent from a current of the voltage source. If such a target voltage is fed to a capacitive load, the resulting output supply voltage at the capacitive load over time depends on the capacitive load, on the resistance between the voltage source and the capacitive load as well as on inductances and capacities between the voltage source and the capacitive load.

In case of a fast increase of the target voltage very high current peaks in conventional systems may occur due to this capacitive load. The power supply device referring to the present invention avoids this current peaks, as the input current to the power supply device is monitored and, if input current exceeds a predetermined threshold, the target voltage generating the output supply voltage is temporarily reduced, which then results in a decrease in the supply current flowing into the input of the power supply device and therefore prevents high current peaks, which could otherwise lead to a total breakdown of a so called raw power supply providing the input voltage.

The temporary reduction of the target value (in contrast to a permanent reduction of the target value) causes on the one hand that the output supply voltage can be continuously increased and on the other hand that supply current peaks at the input side of the power supply device can be avoided.

This reduction of the target voltage can be established very quickly. Due to speed limitations, mainly caused by inductances between the source of the target voltage and the capacitive load, the capacitive load will be charged further during the reduction, so that the output voltage further increases although the input current decreases at this stage.

In other words, by monitoring the supply current flowing into the power supply device, a fast adjustment of the output supply voltage can be achieved without having high current peaks.

According to further embodiments, the power supply device reduces the target voltage until the value of the supply current falls again below the predetermined threshold (or below a further predetermined threshold which may even be lower than the predetermined threshold). In other words, the value of the supply current is low enough again, the supply current monitor increases the target voltage again to its (first) value which it had before it was reduced. If now, after increasing the target value to the first value, the input current flowing into the power supply device exceeds the predetermined threshold again, the supply current monitor again reduces the target voltage to prevent too high current peaks.

By executing this continuous reducing and increasing of the target voltage on the one hand the output voltage can be kept stable throughout all stages of the power ramping and on the other hand a steepness-limited ramp is automatically generated which avoids overloads.

To summarize the above, the supply current monitor (or in general a measuring unit) continuously measures the supply current or input current flowing into the input of the power supply device. In case of over current (in case of the supply current exceeding a predetermined threshold), the nominal output voltage (the target value) will be decreased by a certain amount to lower the input current, provided at the input of the power supply device. Such a decrease can be established very quickly. Due to speed limitations of the output stage (of the output voltage provider) of the power supply device, the output voltage can hardly follow the decrease. Therefore, for a short period the output voltage just stays stable and prevents a further increase of the charge current into the blocking capacitors connected to the output of the power supply device. After a certain amount of time, the input current (the supply current into the input of the power supply device) starts to decrease. When the input current has fallen below a certain threshold, the target voltage (the nominal voltage) is set to the higher level again, restarting the charging process of blocking capacitors but possibly producing a further input current spike. If a further current spike occurs, the above procedure will simply be repeated with the effect of limiting the current again, but at a higher level of the output supply voltage. This procedure can be automatically repeated as often as necessitated, until the output voltage (the output supply voltage) finally reaches its nominal value (the above described first value of the target voltage to which the target voltage is initially set). By this effect, an output voltage ramp at the output of the power supply device will be generated as fast as possible and overload conditions will be avoided. The power supply device can be configured to execute this procedure completely automatic and such that it does neither require any programming nor any operator control. Nevertheless, a flag can be generated to notify the test engineer that this optimization process has happened.

Further embodiments of the present invention relate to a test equipment, comprising a power supply device according to the invention.

Other embodiments of the present invention relate to a method for supplying an electrical power to a capacitive load in a test equipment.

Further embodiments of the present invention relate to a computer program for performing a method according to the invention, when running on a computer.

BRIEF DESCRIPTION OF THE DRAWINGS

Embodiments of the present invention will be described in detail, using the accompanying figures in which.

DETAILED DESCRIPTION OF THE INVENTION

Before the present invention will be described in more details, it is pointed out that, in the figures, functionally equal elements are provided with the same reference numbers and that a repeated description for elements provided with the same reference numbers is omitted. Hence, descriptions provided for elements having the same reference numbers are mutually exchangeable.

Figure 1A:
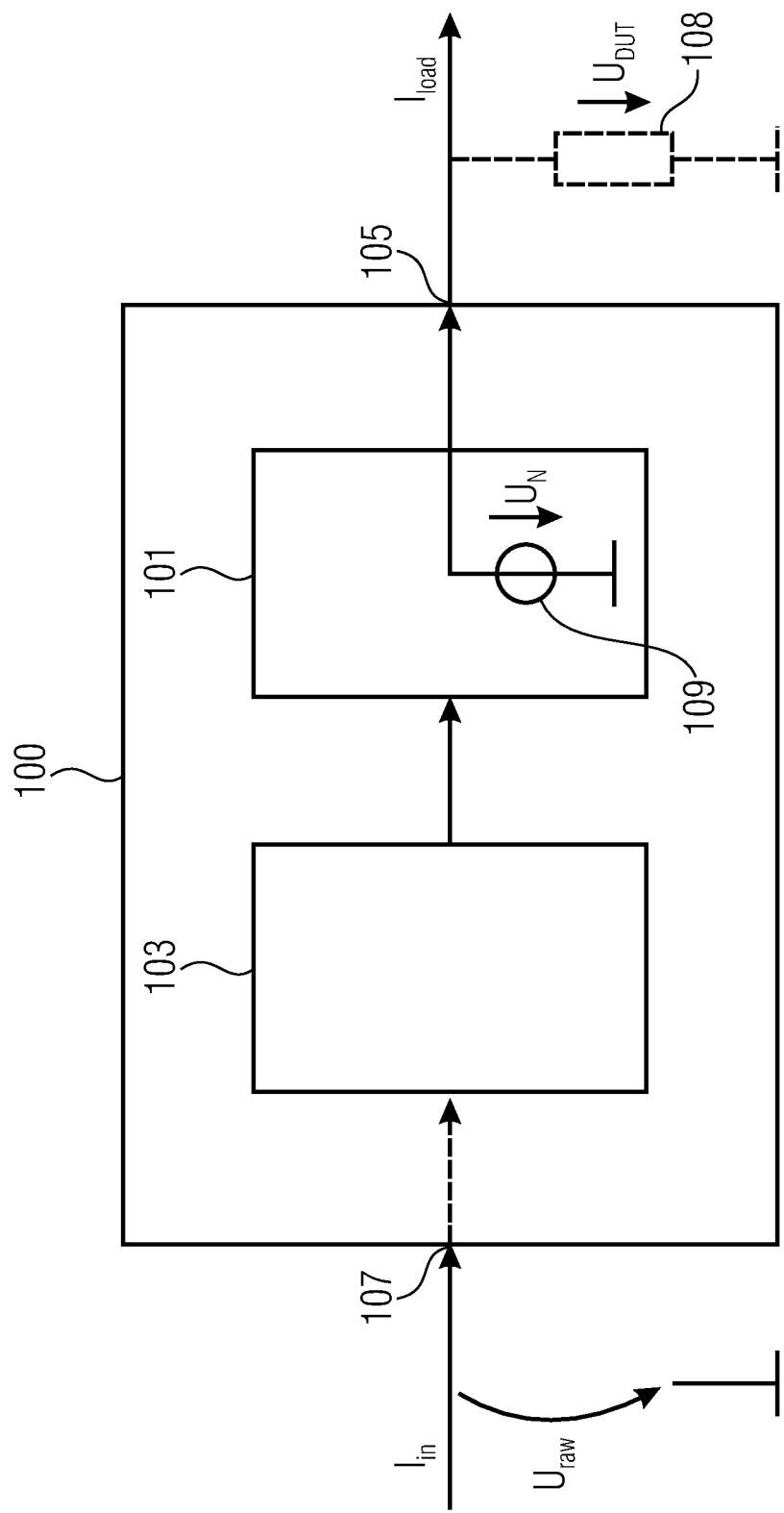
FIG. 1A shows a diagram of a power supply device according to an embodiment of the present invention.

FIG. 1A shows a block schematic diagram of a power supply device 100 for a test equipment 200 (FIG. 2A), which is configured for an at least partly capacitive load 108, according to an embodiment of the present invention.

Continuing, the power supply device 100 comprises an output voltage provider 101 and a supply current monitor 103.

The output voltage provider 101 is configured to generate a target voltage $U_N$, which is energized by an input supply voltage $U_{raw}$ provided at an input 107 of the power supply 100, wherein the target voltage $U_N$ generates an output supply voltage $U_{DUT}$ at the capacitive load ($C_1$ to $C_N$, and 201 in FIG. 1B), when the capacitive load ($C_1$ to $C_N$ and 201 in FIG. 1B) is connected to an output 105 of the power supply 100.

The supply current monitor 103 is configured to monitor a supply current $I_{in}$ flowing into the input 107 of the power supply device 100. Furthermore, to temporarily reduce the target voltage $U_N$ generating the output supply voltage $U_{DUT}$, if a current value of the supply current $I_{in}$ exceeds a first predetermined threshold $T_1$.

The target voltage $U_N$ may be produced by a controllable voltage source 109. Further, the output supply voltage $U_{DUT}$ for the capacitive load 108 is generated by the target voltage $U_N$. As the target voltage $U_N$ is energized by an input supply voltage $U_{raw}$ of the power supply device 100, the supply current $I_{in}$ flowing into the input 107 of the power supply device 100 correlates with the supply current $I_{out}$ flowing out of the output 105 of the power supply device 100.

The capacitive load 108 for the power supply device 100 may consist of an electronic device to be tested and a blocking capacitor, which are connected in parallel with respect to each other.

As already described in the beginning, power supplies 100 for test equipments often have the problem that an output supply voltage $U_{DUT}$ provided by the power supply device 100 has to be changed (e.g., increased) by changing (e.g., increasing) the target voltage $U_N$, which can, due to a capacitive load 108, which may comprise one or more blocking capacitors, and one or more electronic devices under test, coupled to the output 105 of such power supply device 100, result in high current peaks in an input current $I_{in}$, as well as in an output current $I_{out}$ of such a power supply device 100. Such high current peaks can even lead to a total breakdown of the so called raw power supply which supplies the input voltage $U_{raw}$ and the input current $I_{in}$, to the power supply device 100 for supplying one or more devices under test.

The power supply device 100 shown in FIG. 1A solves this issue of having such high current peaks, which could lead to total brake down of a raw power supply supplying the power supply device 100 with the supply current $I_{in}$, by monitoring the supply current $I_{in}$, flowing into the input 107 of the power supply device 100. If now, due to a change of the target voltage $U_N$ of the power supply device 100, a high current peak in the supply current $I_{in}$, occurs (which exceeds the predetermined threshold), the target voltage $U_N$ is reduced, which then results in an automatic reduction of the supply current $I_{in}$, flowing into the input 107 of the power supply device 100. Hence, by temporarily reducing the target voltage $U_N$, an adaption of the output supply voltage $U_{DuT}$ can be achieved in a very fast manner without excessive current spikes in the supply current $I_{in}$, flowing into the input 107 of the power supply device 100. By preventing such current spikes, it can be ensured that a raw power supply providing the supply current $I_{in}$, to the power supply device 100 does not break down, and therefore, a more stable power supply for the test equipment can be achieved compared to conventional systems.

Figure 1B:
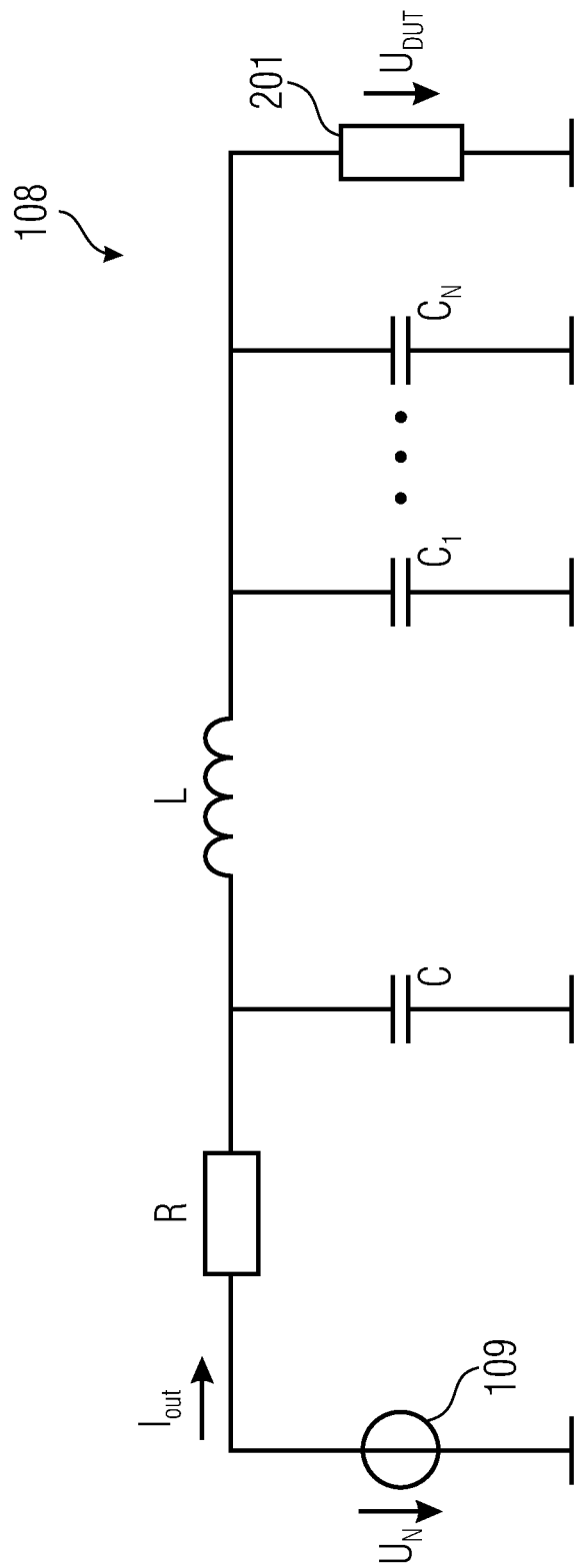
FIG. 1B shows a diagram illustrating the relation between the target voltage and the output supply voltage.

FIG. 1B shows a diagram illustrating the connection between the target voltage and the output supply voltage The target voltage $U_N$ may be an impressed voltage $U_N$ generated internal of the power supply device 100, in particular internal of the output voltage provider 101, which may be controlled by the power supply device 100, in particular by the supply current monitor 103 automatically. The target voltage $U_N$ may be produced by a controllable ideal voltage source 109, wherein the voltage $U_N$ of the voltage source 109 is independent from a current $I_{out}$ of the voltage source 109. If such a target voltage $U_N$ is fed to a capacitive load 108, the resulting output supply voltage $U_{DUT}$ at the capacitive load 108 over time depends on the capacitive load 108, on the resistance R between the voltage source 109 and the capacitive load 108, as well as on inductances L and capacities C between the voltage source 109 and the capacitive load 108. The resistance R represents the internal resistance of the output voltage provider 101 as well as the resistances of the electrical connecting lines of the supply circuit. Further, the inductance L represents all inductances of the supply circuit and the capacities C represents all capacities of the supply circuit.

Further advantages and modifications of the power supply device 100 will be explained next.

Figure 2A:
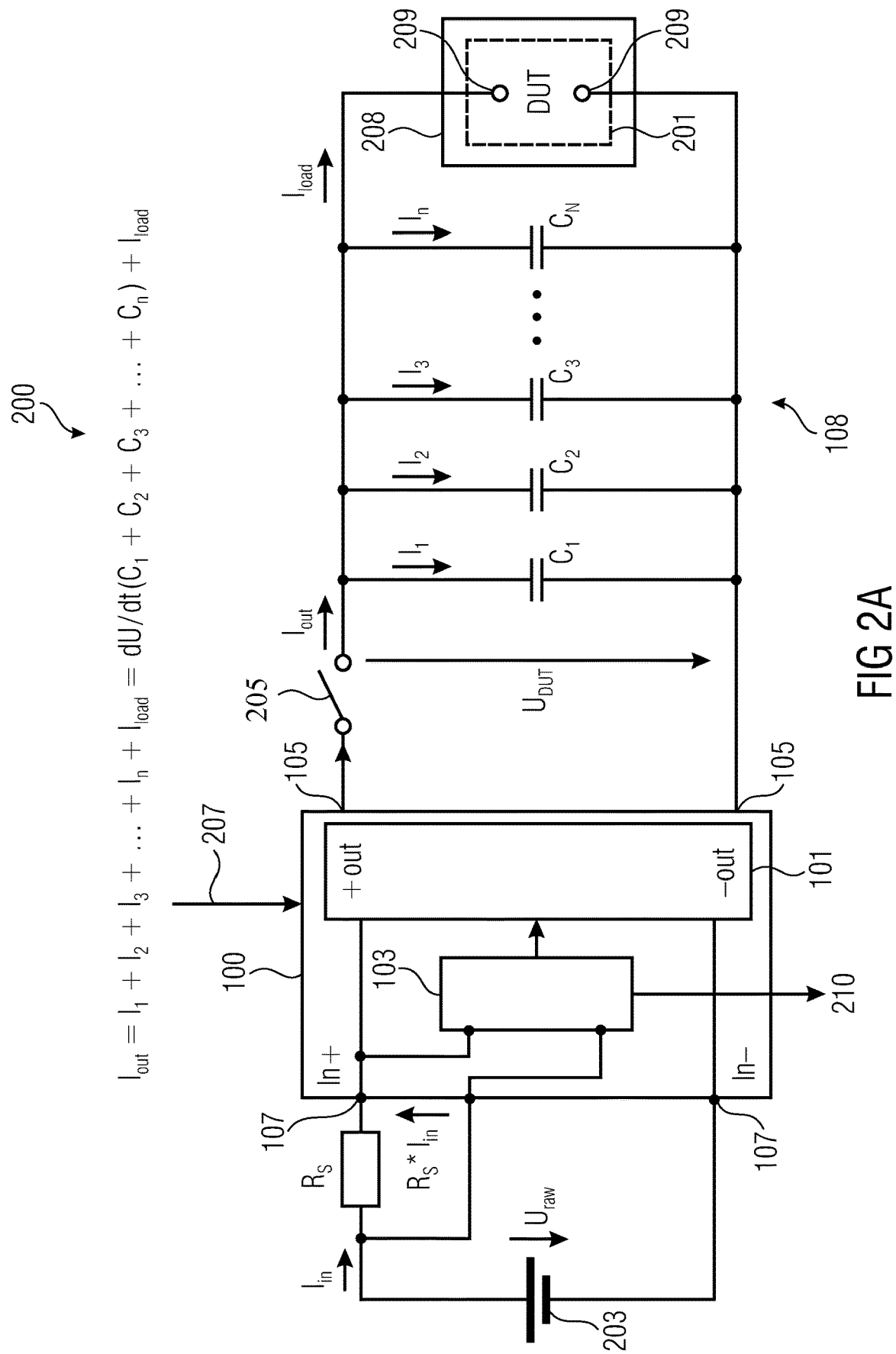
FIG. 2A shows a test equipment, comprising the power supply device shown in FIG. 1A and FIG. 1B.

FIG. 2A shows a test equipment 200 according to further embodiments of the present invention as an exemplary application of the power supply device 100.

The test equipment 200 for testing an electronic device 201, such as a processor 201, comprises a power supply device 100 as described herein, which is configured to provide an output supply voltage $U_{DuT}$, which is used as a supply voltage $U_{DuT}$ for the electronic device 201, while the electronic device 201 is being tested. As can be seen from FIG. 2A, an electronic device 201 is connected to the output 105 of the power supply device 100 while a test is performed. The power supply device 100 provides the output supply voltage $U_{DUT}$ and an output supply current $I_{load}$ for supplying the device under test 200 with energy.

In some embodiments, the test equipment 200 comprises at least one capacitor $C_1$ to $C_N$ connected in parallel with the electronic device (201), while the electronic device (201) is being tested. The at least one capacitor $C_1$ to $C_N$ acts as blocking capacitor.

According to some embodiments, the test equipment 200 comprises a raw power supply 203, which is connected to the input 107 of the power supply device 100 for providing the input supply voltage $U_{raw}$ and the supply current $I_{in}$ to the input 107 of the power supply device 100.

In embodiments, the test equipment 200 comprises a load resister $R_s$ which is connected between the raw power supply 203 and the input 107 of the power supply device 100. The supply current monitor 103 is configured to measure a voltage stroke at the load resistor $R_s$ to determine a value of the supply current $I_{in}$.

Hence, the supply current monitor 103 can be configured to monitor the supply current $I_{in}$ flowing into the input 107 of the power supply device 100 by continuously measuring a voltage stroke at the load resistor $R_s$.

In some embodiments, the test equipment 200 comprises a switch 205 for connecting the output 105 of the power supply device 100 to the blocking capacity $C_1, C_2, C_3 \ldots C_N$ and/or the electronic device 201.

In the example shown in FIG. 2A, only one single device under test 201 is connected to the power supply device 100. However, in a typical application of the power supply device 100, the power supply device 100 may supply a plurality of devices under test 201 with the output supply voltage $U_{DUT}$.

As already described in the foregoing, the power supply device 100 is configured to prevent excessive current peaks in the supply current $I_{in}$ by temporarily reducing a target voltage $U_N$ generating the output supply voltage $U_{DUT}$, if a predetermined threshold for the supply current is exceeded. The threshold may be determined, for example, in dependence on a nominal power of the raw power supply 203, in order to prevent the raw power supply 203 from breaking down due to a too high output load.

According to embodiments, the test equipment 200 further comprises releasable means 208 for connecting the electronic device 201 electrically to the test equipment 200.

In some embodiments, the blocking capacitor $C_1, C_2, C_3 \ldots C_N$ is connected to a power output 209 of the releasable means 208 for connecting the electronic device 201 electrically to the test equipment 200.

In some embodiments the power supply device 100 is configured to set an indication flag 210 in case the output supply voltage $U_{DUT}$ reaches the first value $V_1$ of the target voltage $U_N$. In other words, the power supply device 100 is configured to set the indication flag 210 in response to the output supply voltage $U_{DUT}$ reaching the unreduced value of the target voltage $U_N$.

Figure 2B:
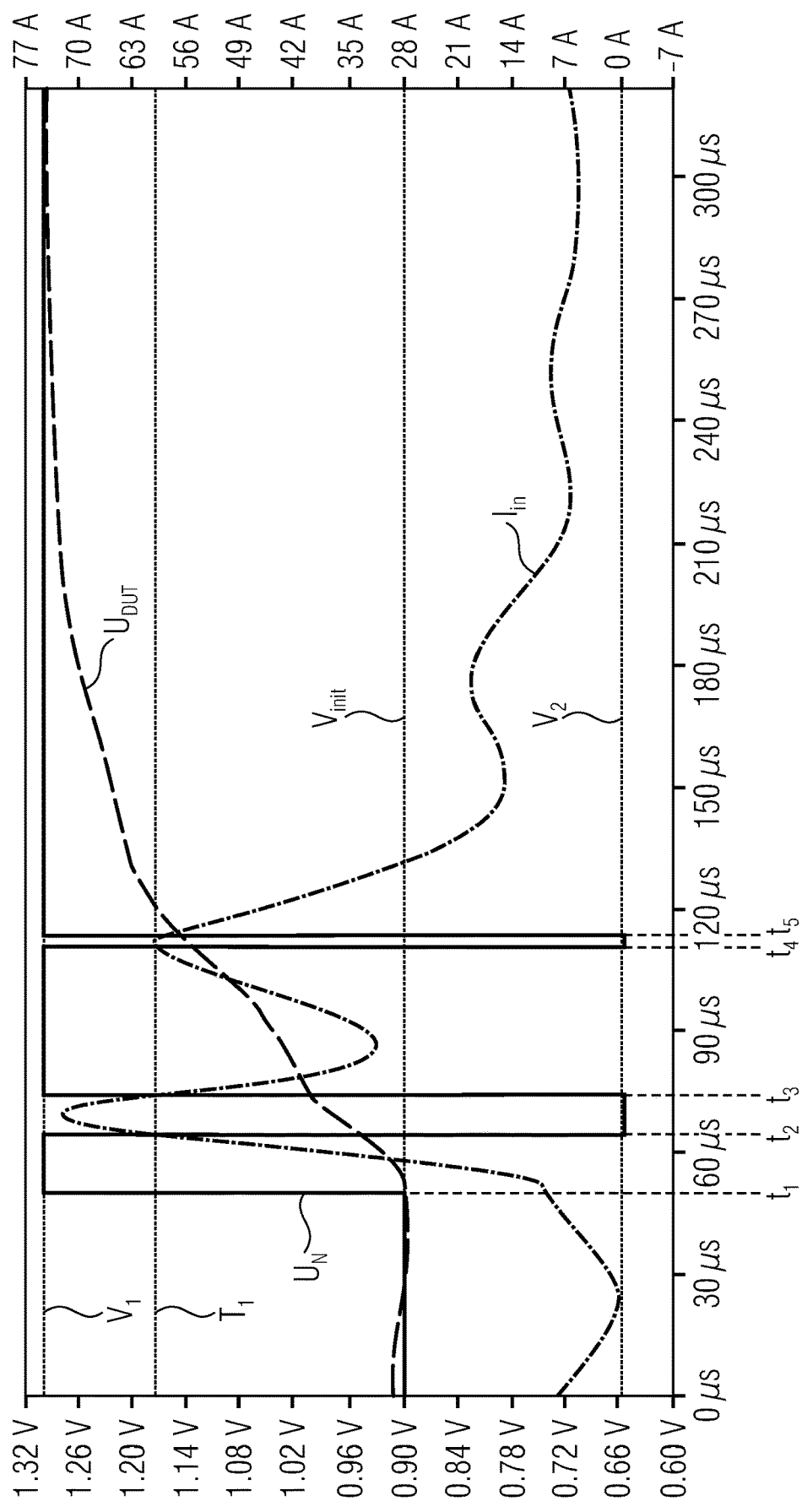
FIG. 2B shows a diagram of an example of the functionality of the power supply device.

FIG. 2B shows in a diagram an example of the functionality of the power supply device 100, shown in FIGS. 1A, 1B and 2A. Herein, a target voltage $U_N$, a resulting output supply voltage $U_{DUT}$ and a resulting supply current $I_{in}$ are shown on a common time axis.

Embodiments of the present invention relate to a power supply device 100 for a capacitive load 108 in a test equipment 200 (FIG. 2A) that comprises an output voltage provider 101 and a supply current monitor 103.

The output voltage provider 101 is configured to generate a target voltage $U_N$, which is energized by an input supply voltage $U_{raw}$ provided at an input 107 of the power supply 100, wherein the target voltage $U_N$ generates an output supply voltage $U_{DUT}$ at the capacitive load 108 ($C_1$, $C_2, C_3 \ldots C_N$, and 201 in FIG. 2A), when the capacitive load 108 ($C_1, C_2, C_3 \ldots C_N$, and 201 in FIG. 2A) is connected to an output 105 of the power supply 100.

Continuing, the supply current monitor 103 is configured to monitor a supply current $I_{in}$, flowing into the input 107 of the power supply device 100. Furthermore, the supply current monitor 103 is configured to temporarily reduce a target voltage $U_N$ generating the output supply voltage $U_{DuT}$, if a current value of the supply current $I_{in}$ exceeds a predetermined threshold $T_1$.

Starting at time $t_1$ the target voltage $U_N$ jumps from an initial value $V_{init}$ to a first value $V_1$ in order to raise the output supply voltage $U_{DUT}$ from the initial value $V_{init}$ to a first value $V_1$. As an example, the initial value is 0.9 volts and the first value is 1.3 volts. This causes the output supply voltage $U_N$ to increase rapidly. Furthermore, this generates a rapid increase of the supply current $I_{in}$, flowing into the input 107 of the power supply device 100. At time $t_2$ the supply current $I_{in}$, exceeds the first predetermined threshold $T_1$. Therefore the nominal voltage $U_N$ or the target voltage $U_N$ is reduced from the first value $V_1$ to a second value $V_2$. This slows down the increase of the output supply voltage $U_{DuT}$ and limits the supply current $I_{in}$. Hence, an excessive current peak is prevented.

In some embodiments, the supply current monitor 103 is configured to increase the target voltage $U_N$ from the second value $V_2$ to the first value $V_1$ if the value of the supply current $I_{in}$ falls below the first predetermined threshold $T_1$ or falls below a second predetermined threshold.

In the example, at time $t_3$ the supply current $I_{in}$, falls below the first predetermined threshold $T_1$. Therefore, the target voltage $U_N$ is set back to the first value $V_1$ (in this example 1.3 volts), which leads to an increasing of the supply current $I_{in}$, but this increasing is limited the same way as before by the supply current monitor 103 by temporarily reducing the target voltage $U_N$ from the first value $V_1$ to the second value $V_2$ during the time interval from $t_4$ to $t_5$.

As already mentioned, the reduction of the target voltage $U_N$ only happens temporarily, for example, at least as long as the supply current $I_{in}$, is bigger than the predetermined threshold $T_1$ such that after the supply current $I_{in}$, has fallen below the predetermined threshold $T_1$, the target voltage $U_N$ is again increased from the second value $V_2$ to the first value $V_1$ to ensure that after the complete optimization process the output supply voltage $U_{DUT}$ reaches the first value $V_1$ of the target voltage $U_N$, which is desired to be achieved.

If the supply current monitor 103 is configured to increase the target voltage $U_N$ from the second value $V_2$ to the first value $V_1$ again, if the value of the supply current falls below a second predetermined threshold $T_2$, which is lower than the first predetermined threshold $T_1$, a hysteresis function is implemented, wherein the first threshold $T_1$ for reducing the target voltage $U_N$ is higher than the second threshold $T_2$ for increasing the target voltage $U_N$.

Such a hysteresis can be used, for example for preventing a too often switching of the target voltage between the first value $V_1$ and the second value $V_2$ and vice versa.

In some embodiments, the supply current monitor 103 is configured to repeatedly reduce the target voltage $U_N$ in response to the current value of the supply current $I_{in}$ exceeding the predetermined first threshold $T_1$ and to repeatedly increase the target voltage $U_N$ in response to the current value of the supply current $I_{in}$ falling below the predetermined first threshold $T_1$ or the second predetermined threshold $T_2$.

This means, that the supply current monitor 103 is configured to repeat this process of decreasing and increasing the target voltage $U_N$ from the first value $V_1$ to the second value $V_2$ and from the second value $V_2$ to the first value $V_1$ until the output supply voltage $U_{DUT}$ reaches the first value $V_1$. In other words, the supply current monitor 103 is configured to reduce the target voltage $U_N$ repeatedly, when the value of the supply current $I_{in}$ exceeds the first predetermined threshold $T_1$ and increase the target voltage $U_N$ again, when the value of the supply current $I_{in}$ falls below the first predetermined threshold $T1$ or the second predetermined threshold $T_2$.

Furthermore, as exemplarily shown in the example of FIG. 2B, the supply current monitor 103 is configured to reduce the target voltage $U_N$ from a first value $V_1$ to a second value $V_2$, wherein the second value $V_2$ is in a range of 0% to 60% of the first value $V_1$, advantageously in a range of 5% to 50% of the first value $V_1$, most advantageously in a range of 10% to 40% of the first value $V_1$.

In some embodiments, the supply current monitor 103 is configured in such way that, in case a rise of the target voltage $U_N$ from an initial value $V_{init}$ the first value $V_1$ occurs and the supply current $I_{in}$ exceeds the predetermined first threshold $T_1$ due to the rise, the second predetermined value $V_2$ is set below the initial value $V_{init}$.

In the example shown in FIG. 2B, such an initial value $V_{init}$ of the target voltage is 0.9 volts, which may be also the initial value of the output supply voltage $U_{DUT}$. Furthermore, the second value $V_2$ in the example is 0.65 volts, which is lower than the initial value $V_{init}$. By having the second value $V_2$ lower than the initial value $V_{init}$, it can be achieved that after reducing the target voltage $U_N$ from the first value $V_1$ to the second value $V_2$, the supply current $I_{in}$ decreases very fast.

According to an embodiment, the power supply device 100 is configured to receive a target voltage adjust signal 207 (see FIG. 2A) indicating the first value $V_1$ for the target voltage $U_N$ and to adjust the target voltage $U_N$ to the first value $V_1$ indicated in the output voltage adjust signal 207, when receiving the output voltage adjust signal 207.

In other words, the power supply device 100 is configured to change, in response to a reception of the output voltage adjust signal 207 the target voltage $U_N$ of the power supply device 100. Furthermore, the power supply device 100 may, but does not need, to receive the second value $V_2$ of the target voltage $U_N$ to which the target voltage $U_N$ is reduced, when the supply current $I_{in}$, exceeds the predetermined threshold $T_1$, as the supply current monitor 103 may be capable of determining the second value $V_2$ based on the first value $V_1$ indicated in the output voltage adjust signal 207 and/or in dependence on the initial value $V_{init}$ of the target voltage $U_N$, which was set before the power supply device 100 received the output voltage adjust signal 207 (FIG. 2A).

In an embodiment of the invention, a self-adapting power supply device 100 solves the issues described in the introductory part of the application. The power supply device 100 keeps the output voltage stable throughout all stages of the power ramping and automatically generates a steepness-limited limited ramp which avoids overload.

In the power supply device 100, a measuring unit (see supply current monitor 103) continuously measures the input current or supply current $I_{in}$. In case of over currents, the nominal output voltage (the target voltage $U_N$) will be decreased by a certain amount to lower the output voltage $Up_{DUT}$. This decrease can be established very quickly by the output voltage provider 101. The output voltage provider 101 may be, for example, a switch voltage regulator or may be also a linear voltage regulator.

Due to speed limitations of the output stage of the power supply device 100, the output voltage (the output supply voltage $U_{DUT}$) can hardly follow the decrease. Therefore, in the very first moment, the output voltage $U_{DUT}$ just stays stable (or even increases) and provide a further increase of the charge current $I_1, I_2, I_3 \ldots I_N$ into the blocking capacitors $C_1, C_2, C_3 \ldots C_N$. However, after a certain amount of time, the input current (the supply current $I_{in}$) starts to decrease and when it falls below a certain threshold (the first predetermined threshold $T_1$), the nominal voltage (the target voltage $U_N$) is set to the higher level again by the supply current monitor 103. This leads to a restarting of the charging process of the blocking capacitors $C_1, C_2, C_3 \ldots C_N$ possibly producing a further input current spike in the supply current $I_n$. If now further current spike occurs in the supply current $I_{in}$, the above procedure will simply be repeated, with the effect of limiting the current again, but at a higher level of the output supply voltage $U_{DUT}$. This procedure will be automatically repeated as often as necessitated until the output supply voltage $U_{DUT}$ finally reaches its nominal value (the target voltage $U_N$). By this effect, a desired output supply voltage $U_{DUT}$ can be generated as fast as possible and overload conditions for the raw power supply 203 may be avoided. This procedure can be executed by the power supply device 100 completely automatic and does neither require any programming nor any operator control. As already mentioned, just an indication flag can be generated to notify the test engineer that this optimization process has happened.

Figure 3:
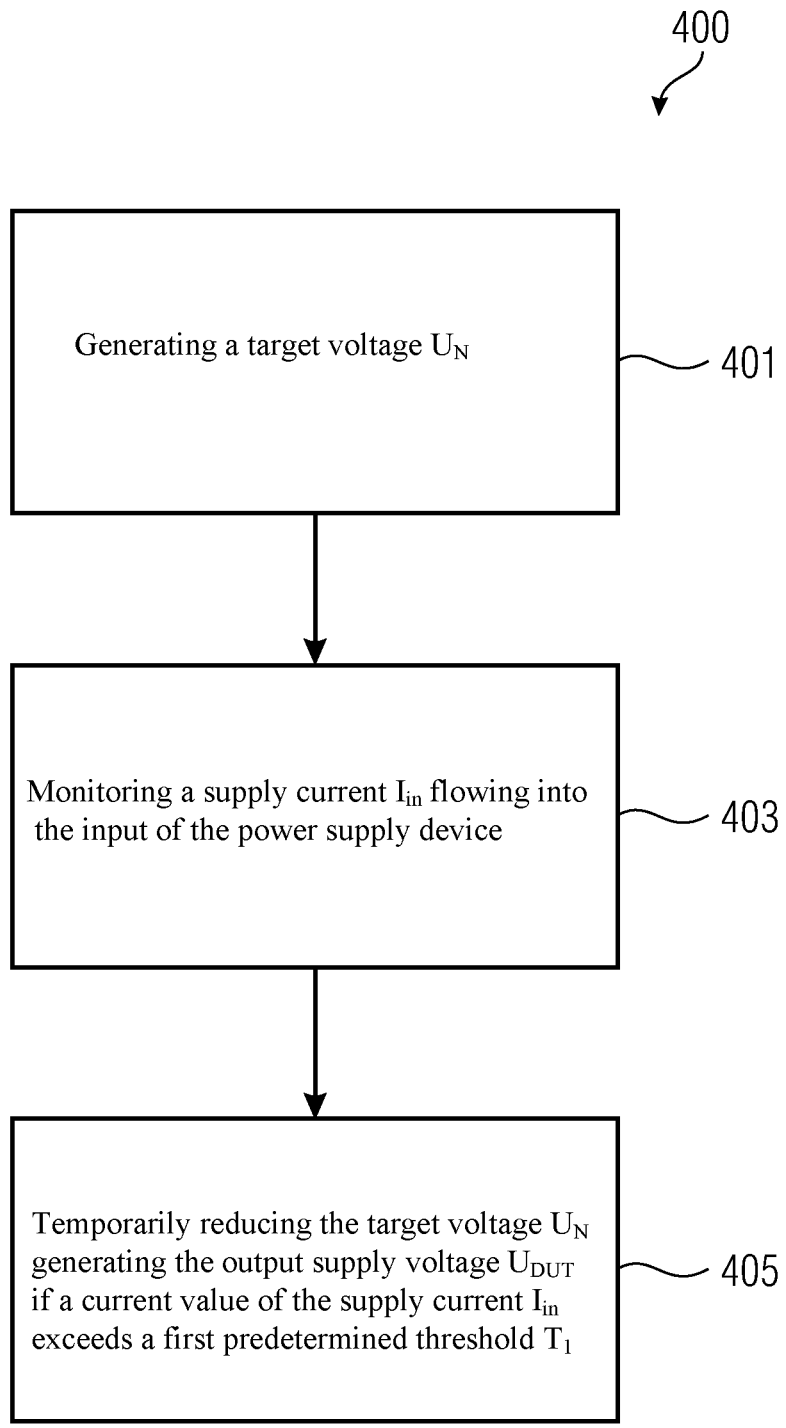
FIG. 3 shows an exemplary flow-chart of a method for providing an output supply voltage according to an embodiment of the present invention.

FIG. 3 shows a flow-chart of a method 400 according to an embodiment of the present invention for supplying an electrical power to an at least partly capacitive load 108 ($C_1, C_2, C_3 \ldots C_N$ and 201 in FIG. 2A) in a test arrangement 200 (FIG. 2A) with a power supply device 100.

The method 400 comprises a step 401 of generating a target voltage $U_N$, which is energized by an input supply voltage $U_{raw}$ provided at an input 107 of the power supply device 100, wherein the target voltage $U_N$ generates an output supply voltage $U_{DUT}$ at the capacitive load 108 ($C_1, C_2, C_3 \ldots C_N$ and 201 in FIG. 2A), when the capacitive load 108 ($C_1, C_2, C_3 \ldots C_N$ and 201 in FIG. 2A) is connected to an output 105 of the power supply device 100.

Furthermore, the method 400 comprises a step 403 of monitoring a supply current $I_{in}$, flowing into the input 107 (FIGS. 1A and 2A) of the power supply device 100.

Furthermore, the method 400, comprises a step 405 of temporarily reducing the target voltage $U_N$ generating the output supply voltage $U_{DUT}$ if a current value of the supply current $I_{in}$ exceeds a first predetermined threshold $T_1$ (FIG. 2B).

The method 400 can be performed, for example, using the power supply device 100 described in conjunction with the FIGS. 1A, 1B, 2A and 2B.

The method 400 may be supplemented by any features of the power supply 100 and/or the test equipment as described herein.

Depending on certain implementation requirements, embodiments of the invention can be implemented in hardware or in software. The implementation can be performed using a non-transitory storage medium such as a digital storage medium, for example a floppy disc, a DVD, a Blu-Ray, a CD, a ROM, a PROM, and EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may, for example, be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, wherein the computer program runs on a computer.

A further embodiment of the inventive method is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the invention method is, therefore, a data stream or a sequence of signals representing the computer program for performing one of the methods described herein. The data stream or the sequence of signals may, for example, be configured to be transferred via a data communication connection, for example, via the internet.

A further embodiment comprises a processing means, for example, a computer or a programmable logic device, configured to, or adapted to, perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example, a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A power supply device comprising:
an input operable to receive a supply current;
an output;
an output voltage provider configured to generate a target voltage, wherein the target voltage is provided to the output to supply an output supply voltage for an at least partly capacitive load associated with an electronic device under test; and
a supply current monitor configured to monitor the supply current that flows into the input of the power supply device and to temporarily reduce the target voltage that supplies the output supply voltage, wherein the target voltage is temporarily reduced from a first value to a second value if a monitored current value of the supply current exceeds a first predetermined threshold, wherein the target voltage is energized by an input supply voltage provided at the input of the power supply device, and wherein the supply current monitor is configured to increase the target voltage from the second value to the first value if the current value of the supply current falls below the first predetermined threshold or a second predetermined threshold, and to set the second predetermined value below an initial value if a rise of the target voltage from the initial value to the first value occurs and the supply current exceeds the first predetermined threshold due to the rise.

2. The power supply device according to claim 1, wherein the second value is one of a value in a range of 0% to 60% of the first value, a value in a range of 5% to 50% of the first value, or a value in a range of 10% to 40% of the first value.

3. The power supply device according to claim 1, wherein the supply current monitor is configured to repeatedly reduce the target voltage in response to the current value of the supply current exceeding the first predetermined threshold and to repeatedly increase the target voltage in response to the current value of the supply current falling below the first predetermined threshold or the second predetermined threshold.

4. The power supply device according to claim 3, wherein the supply current monitor is configured to perform the repeated reducing and increasing of the target voltage until the output supply voltage has reached the first value of the target voltage.

5. The power supply device according to claim 2, further comprising a control input configured to receive a target voltage adjust signal that indicates the first value of the target voltage and that causes adjustment of the target voltage to the first value.

6. The power supply device according to claim 2, further comprising a voltage indication output configured to output an indication flag if the output supply voltage reaches the first value of the target voltage.

7. A test equipment for testing an electronic device, comprising:
- a power supply device configured to provide an output supply voltage for the electronic device to be tested, wherein the power supply device includes:
- an input operable to receive a supply current;
- an output;
- an output voltage provider configured to generate a target voltage, wherein the target voltage is provided to the output to supply the output supply voltage;
- a supply current monitor configured to monitor the supply current that flows into the input of the power supply device and to temporarily reduce the target voltage that supplies the output supply voltage if a monitored current value of the supply current exceeds a first predetermined threshold;
- a releasable element configured to connect the electronic device electrically to the power supply device; and
- at least one blocking capacitor, which is connected in parallel with the electronic device to be tested.

8. The test equipment according to claim 7, further comprising a raw power supply, which is connected to the input of the power supply device and is configured to provide an input supply voltage to the input of the power supply device to energize the target voltage and to provide the supply current to the input of the power supply device.

9. The test equipment according to claim 8, wherein the blocking capacitor is connected to a power output of the releasable element.

10. The test equipment according to claim 8, further comprising a switch for connecting the output of the power supply device to the blocking capacitor and/or the electronic device, wherein the electronic device comprises a processor, and wherein the test equipment is an automated test equipment.

11. A method for supplying an electrical power, the method comprising:
- generating a target voltage by using a power supply device in automated test equipment configured to supply power at a multiple of regular operating power of a device under test, wherein the generating the target voltage includes providing the target voltage to an output of the power supply device to supply an output supply voltage for an at least partly capacitive load;
- receiving a supply current at an input of the power supply device;
- monitoring the supply current that flows into the input of the power supply device;
- releasably connecting an electronic device electrically to the power supply device;
- blocking direct current with a blocking capacitor, wherein the blocking capacitor is coupled in parallel with the device under test; and
- temporarily reducing the target voltage if a monitored current value of the supply current exceeds a first predetermined threshold.

12. The method of claim 11, further comprising:
- energizing the target voltage by using an input supply voltage provided at the input of the power supply device.

13. A non-transitory digital storage medium having stored thereon a computer program for performing a method for supplying an electrical power, the method comprising:
- generating a target voltage by using a power supply device in automated test equipment configured to supply power at a multiple of regular operating power of a device under test, wherein the generating the target voltage includes providing the target voltage to an output of the power supply device to supply an output supply voltage for an at least partly capacitive load;
- receiving a supply current at an input of the power supply device;
- monitoring the supply current that flows into the input of the power supply device;
- releasably connecting an electronic device electrically to the power supply device;
- blocking direct current with a blocking capacitor, wherein the blocking capacitor is coupled in parallel with the device under test;
- temporarily reducing the target voltage if a monitored current value of the supply current exceeds a first predetermined threshold; and
- increasing the target voltage if a monitored current value of the supply current drops below the first predetermined threshold.

14. The non-transitory digital storage medium of claim 13, wherein the method further comprises:
- energizing the target voltage by using an input supply voltage provided at the input of the power supply device.

* * * * *